United States Patent [19]
Kim et al.

[11] Patent Number: 5,504,627
[45] Date of Patent: Apr. 2, 1996

[54] PROJECTION EXPOSURE SYSTEM

[75] Inventors: Hak Kim, Seoul; Ho-young Kang, Suwon, both of Rep. of Korea

[73] Assignee: Samsung Electronics Co., Ltd., Suwon, Rep. of Korea

[21] Appl. No.: 138,223

[22] Filed: Oct. 20, 1993

[30] Foreign Application Priority Data

Oct. 20, 1992 [KR] Rep. of Korea ............... 92-19223
Oct. 21, 1992 [KR] Rep. of Korea ............... 92-19304

[51] Int. Cl.$^6$ ................... G02B 17/00; G02B 27/10
[52] U.S. Cl. ........................... 359/729; 359/619
[58] Field of Search .................... 359/619, 729, 359/728, 625, 626, 627, 628

[56] References Cited

U.S. PATENT DOCUMENTS 5,365,374 11/1994 Nishikawa et al. .............. 359/619
5,547,526 12/1970 Devereux ........................ 359/729

Primary Examiner—Scott J. Sugarman
Attorney, Agent, or Firm—Cushman Darby & Cushman

[57] ABSTRACT

A projection exposure system includes a light transmitting member located between a light source and fly's eye lens to receive most of the incident light and to transmit the incident light to the periphery of the fly's eye lens. Light transmission of the system may be carried out by a light pipe and conic reflection mirror concentrically placed therein, or by an optical fiber flux having a light entrance pupil consisting of a bundle of individual units and a ramified light exit pupil. The system has high light-utilizing efficiency and reduced exposure time because most of the incident light is used.

20 Claims, 3 Drawing Sheets

PROJECTION EXPOSURE SYSTEM

BACKGROUND OF THE INVENTION

The present invention relates to a projection exposure system, and more particularly, to a transformed illumination system of a projection exposure system used in a photolithography process.

The primary technique for acquiring fine patterns for liquid crystal displays or semiconductor devices is photolithography. When using photolithography, projection exposing technology affects the packing density and quality of the resulting semiconductor devices.

An excimer laser stepper, which reduces the wavelength of the light source used, a phase shift mask, and transformed illumination such as tilted illumination have been used to improve projection exposing technology.

Transformed illumination has been of great interest because it improves resolution without new equipment. Conventional transformed illumination technology for use in a projection exposure system will be explained with reference to FIGS. 1, 2 and 3.

The projection exposure system illustrated in FIG. 1 that provides transformed illumination has a filter 3 attached to a conventional illuminator containing a light source 1, a fly's eye lens 2, a condenser lens 4 and a mask 5. The filter is constructed as shown in FIGS. 2 and 3, with FIG. 2 illustrating an annular illumination filter and FIG. 3 illustrating a four-point illumination filter. In FIGS. 2 and 3, hatched portions indicate light blocking portions and unhatched portions indicate light transmitting portions.

In the annular conventional illumination filter that provides tilted illumination, light transmittivity is $(\sigma_o^2 - \sigma_i^2)/\sigma_o^2$. Usually, since the most appropriate value of $\sigma_i$ is $(2/3)\sigma_o$, the transmittivity becomes five ninths and the exposing time is approximately double that when the transmittivity is one, resulting in greatly reduced productivity.

In the case of four-point illumination, the transmittivity is $4\sigma_i^2/\sigma_o^2$. Here since $\sigma_i = (1/4)\sigma_o$, the transmittivity becomes one fourth and the exposing time is approximately quadrupled, to further deteriorate the productivity.

SUMMARY OF THE INVENTION

Therefore, it is an object of the present invention to provide a projection exposure system having a high light-utilizing efficiency.

To accomplish the object, there is provided a projection exposure system having a light source, a fly's eye lens for receiving light from the light source to illuminate a mask, and a transformed illumination device for forming the illumination as a transformed illumination, wherein the transformed illumination device is a light transmitting member for performing tilted illumination to the mask, which is located between the light source and fly's lens on a light path and comprises a light entrance pupil formed to receive light from the light source and a light exit pupil formed to transmit light passing through the light entrance pupil to the periphery of the fly's eye lens.

In the projection exposure system, the light transmitting member may comprise a light pipe having the light entrance pupil and light exit pupil, and a conic reflection mirror which is concentrically installed in the light pipe. Further, the light transmitting member may be formed with an optical fiber flux having a light entrance pupil consisting of a bundle of individual units and a light exit pupil which is ramified into a multitude of individual units.

According to patterns of its light exit pupil, the light transmitting member of the present invention forms a transformed illumination system, and receives most of the light from the light source to transmit the incident light to portions which require light, thereby maximizing light utilizing efficiency.

BRIEF DESCRIPTION OF THE DRAWINGS

The above object and other advantages of the present invention will become more apparent by describing in detail a preferred embodiment thereof with reference to the attached drawings in which.

DETAILED DESCRIPTION OF THE INVENTION

Figure 1:
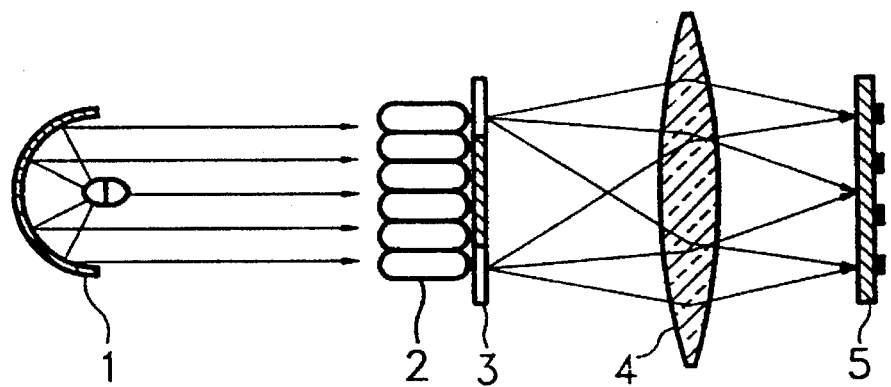
FIG. 1 illustrates schematically a transformed illumination system of a conventional projection exposure system.
Figure 2:
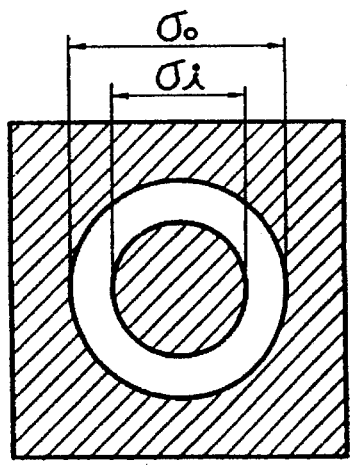
FIG. 2 illustrates an annular illumination for the transformed illumination of the projection exposure system shown in FIG. 1.
Figure 3:
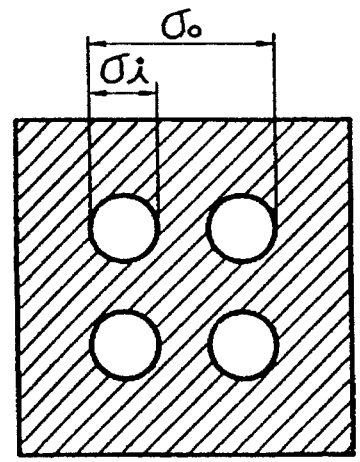
FIG. 3 illustrates a four-point illumination for the transformed illumination of the projection exposure system shown in FIG. 1.
Figure 4:
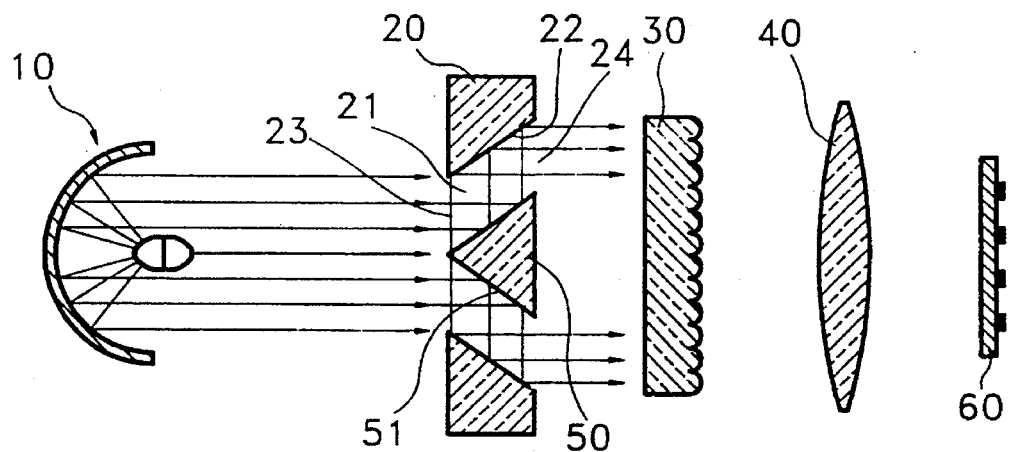
FIG. 4 is a side view illustrating a first embodiment of a transformed illumination of a projection exposure system of the present invention.

Referring to FIG. 4, illustrating the first embodiment of the present invention, the present invention includes a light source 10, a fly's eye lens 30 which receives light from light source 10 through light pipe 20 and a condenser lens 40, located between fly's eye lens 30 and mask 60 for condensing the light in a desired direction. In this embodiment, the transformed or tilted illumination is comprised of a light pipe 20 and a conic reflection mirror 50. According to the features of the present invention, the light pipe and conic reflection mirror are formed to receive most of the incident light and to transmit the received incident light to portions which require light. The configuration of the light pipe and reflection mirror will be described below.

Light pipe 20 is located between light source 10 and fly's eye lens 30 on the light proceeding path, and is formed to pass light therethrough. The light entrance pupil 23 of light pipe 20 on the side of light source 10 should be formed only as large as necessary for reception of most of the light emitted from light source 10.

Conic reflection mirror 50 is concentrically disposed inside light pipe 20. Here, the apex of conic reflection mirror 50 should be directed toward the light source, and the diameter of the bottom surface of the mirror should be smaller than the inner diameter of light pipe 20.

Preferably, the inner surface of light pipe 20 and the flanks of conic reflection mirror 50 are formed with a high reflection surface. For example, an aluminum film, which is a high reflection metal film, is desirably evaporated onto the surfaces to reflect most of the incident light. Since the inner surface of light pipe 20 is tilted to be parallel with the flanks of conic reflection mirror 50, the incident light is reflected perpendicularly.

The diameters of light entrance pupil 23 and light exit pupil 24 of the light pipe 20 and the diameter of the bottom of conic reflection mirror 50 may be modified according to the pattern of the transformed illumination. In the conventional projection exposure system, it is appropriate that the inner diameter of the light pipe be about 40–50 mm and that the length thereof be about 150 mm. It is further appropriate that the diameter of the bottom of the conic reflection mirror be about two thirds the inner diameter of the light exit pupil of the light pipe.

Figure 5:
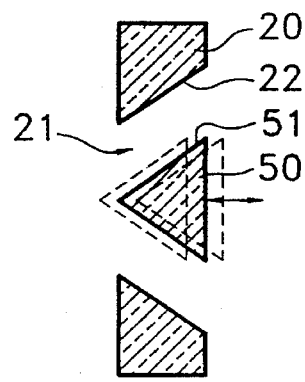
FIG. 5 is an extracted view of the light transmitting member shown in FIG. 4.

As shown in FIG. 5, it is desirable that conic reflection mirror 50 is installed to move in the axial direction and then to control the aperture area of a light passing hole, thereby finely controlling a light irradiating area.

Now, the operation of the first embodiment of the present invention will be described below.

Most of the light emitted from light source 10 (e.g., a mercury lamp) is received at the light entrance pupil 23 of light pipe 20 and reflected from the flanks of conic reflection mirror 50 and the inner surface of light pipe 20, to enter fly's eye lens 30 via light exit pupil 24. The light striking the center of light pipe 20 in which conic reflection mirror 50 is provided, is reflected by conic reflection mirror 50 and light pipe 20, thereby colliding with the periphery of fly's eye lens 30. The light passing outside conic reflection mirror 50 passes without change, to strike the periphery of fly's eye lens 30. The light passing the periphery of fly's eye lens 30 forms a secondary light source to illuminate mask 50 via condenser lens 40. This accomplishes the tilted illumination.

Figure 6:
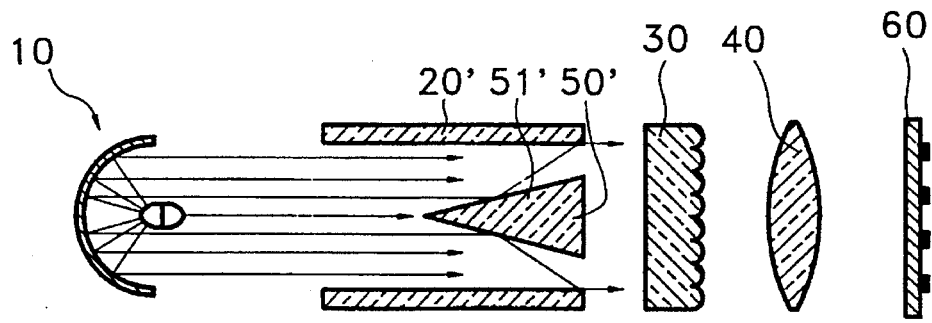
FIG. 6 is a side view illustrating a second embodiment of a transformed illumination of a projection exposure system of the present invention.

Referring to FIG. 6, in the same way as that of the first embodiment, the tilted illumination is performed by light pipe 20' and conic reflection mirror 50' while raising the light utilizing efficiency, which is the achievement of the objects of the present invention. The difference from the first embodiment is that the length of conic reflection mirror 50' is shorter than that of light pipe 20' and that the inner surface of the light pipe is not tilted. In this embodiment, preferably the length of the conic reflection mirror be 90% the length of the light pipe. The operation of the second embodiment is the same as that of the first embodiment.

The first and second embodiments are suitable to perform the transformed illumination using the annular illumination.

Figure 7:
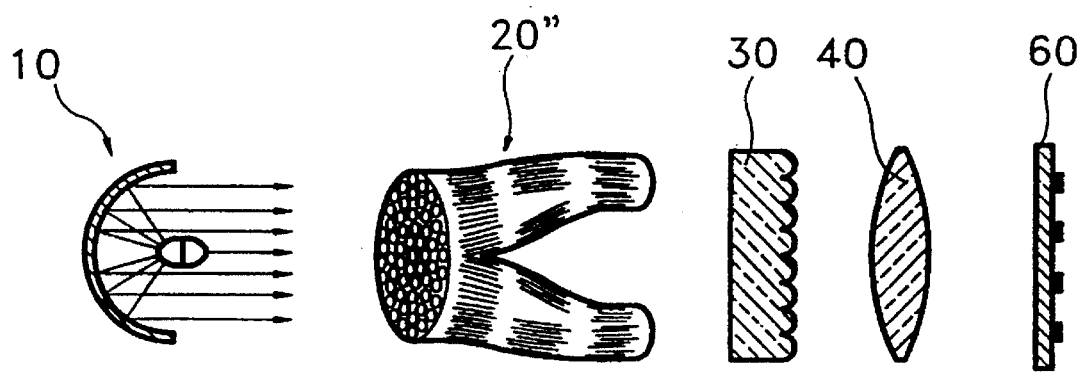
FIG. 7 is a side view illustrating a third embodiment of a transformed illumination of a projection exposure system of the present invention.

Referring to FIG. 7, in the same way as those of the first and second embodiments, the third embodiment comprises a light source 10, a fly's lens 30 which receives light from light source 10 to illuminate a mask 60, and a condenser lens 40 located between fly's lens 30 and mask 60 for condensing the light in a desired direction. They are disposed on the light proceeding path. The difference from the first and second embodiments is that light transmitting is carried by optical fiber flux 20" in the transformed illumination. The optical fiber flux 20" receives most of the incident light to transmit the received incident light to portions which require light. The optical fiber flux will be further explained hereinbelow.

Figure 8:
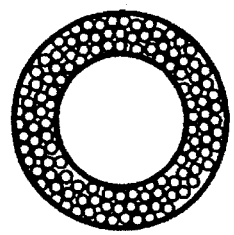
FIG. 8 illustrates an annular illumination of the transformed illumination shown in FIG. 7.
Figure 9:
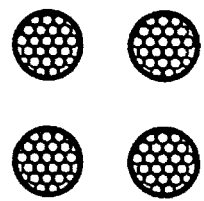
FIG. 9 illustrates a four-point illumination of the transformed illumination shown in FIG. 7.

The optical fiber flux 20" has a light entrance pupil consisting of a bundle of individual units, to receive most of the light source, and a light exit pupil modified or divided into predetermined shapes according to the configuration of the transformed illumination. The light exit pupil is split into a multitude of individual units to form multiple-point illumination such as two-point or four-point illumination. The light exit pupil may be formed to be annular and to thereby perform annular illumination. FIG. 8 shows the annular illumination. FIG. 9 shows the four-point illumination.

The material of the optical fiber of the optical fiber flux should be changed according to light sources employed. Usually, the G line (436 nm) and I line (365 nm) are used. With respect to the excimer laser, pure silica glass fiber is used.

The third embodiment is useful for illuminators employing two-point, four-point and annular light sources.

As described above in detail, since the projection exposure system of the present invention performs the tilted illumination, using a light transmitting member for receiving most of the light emitted from a light source and transmitting the light to the portions where it is required, the present invention has a light utilizing efficiency which is far higher than the tilted illumination performed by the conventional filter. Therefore, the present invention greatly reduces exposure time, to thereby greatly enhance productivity.

The projection exposure system of the present invention is not confined to the field of semiconductor device fabrication, but can be employed in the fabrication of various devices using projection light.

While the present invention has been particularly shown and described with reference to particular embodiments thereof, it will be understood by those skilled in the art that various changes in form and details may be effected therein without departing from the spirit and scope of the invention as described by the appended claims.

What is claimed is:

1. A projection exposure system comprising:

a light source for producing light;

transformed illumination means for forming a transformed illumination, said transformed illumination means including a light transmitting member for performing tilted illumination to provide tilted illuminated light, said light transmitting member including a light entrance pupil and a light exit pupil;

a fly's eye lens that receives said tilted illuminated light and diverges said tilted illuminated light to provide diverging tilted illuminated light;

a mask that receives said diverging tilted illuminated light.

2. A projection exposure system according to claim 1, wherein said light transmitting member is an optical fiber flux in which said light entrance pupil includes a bundle of individual units and said light exit pupil is divided into a plurality of predetermined shapes according to patterns of transformed illumination.

3. A projection exposure system according to claim 2, wherein said light exit pupil of said optical fiber flux is split into a multitude of individual units to provide four-point illumination.

4. A projection exposure system according to claim 2, wherein said light exit pupil of said optical fiber flux is annular in shape to thereby perform annular illumination.

5. A projection exposure system according to claim 2, wherein said optical fiber flux is made of silica glass to transmit deep UV light.

6. A projection exposure system according to claim 1, further comprising a condenser lens for focussing said diverging tilted illuminated light to produce condensed light for reception by said mask.

7. A projection exposure system according to claim 1, wherein an inner surface of said light pipe is about 40–50 mm in diameter and a length of said light pipe is about 150 mm.

8. A projection exposure system comprising:

a light source for producing light;

transformed illumination means for forming a transformed illumination, said transformed illumination means including a light transmitting member for performing tilted illumination to provide tilted illuminated light, said light transmitting member comprising:

a light pipe having a light entrance pupil and a light exit pupil, and a conic reflection mirror concentrically disposed in said light pipe having an apex directed toward said light source, said conic reflection mirror having a bottom diameter that is smaller than an inner diameter of said light exit pupil;

a fly's eye lens that receives said tilted illuminated light and diverges said tilted illuminated light to provide diverging tilted illuminated light; and a mask that receives said diverging tilted illuminated light.

9. A projection exposure system according to claim 8, wherein an inner surface of said light pipe and an external surface of said conic reflection mirror are each reflective.

10. A projection exposure system according to claim 9, wherein said inner surface of said light pipe and said external surface of said conic reflection mirror are inclined to reflect said light perpendicularly.

11. A projection exposure system according to claim 8, wherein said conic reflection mirror is adaptable to move in an axial direction.

12. A projection exposure system according to claim 8, wherein said bottom diameter of said conic reflection mirror is about two thirds said inner diameter of said light exit pupil of said light pipe.

13. A projection exposure system according to claim 8, further comprising a condenser lens for focussing said diverging tilted illuminated light to produce condensed light for reception by said mask.

14. A projection exposure system according to claim 9, wherein said reflective surfaces are provided by an aluminum film.

15. A projection exposure system according to claim 10, wherein said inclined inner surface of said light pipe is parallel with said external surface of said conic reflection mirror.

16. A projection exposure system according to claim 9, wherein said inner surface of said light pipe is parallel to said produced light and said external surface of said conic reflection mirror is inclined to reflect said produced light toward said inner surface of said light pipe.

17. A projection exposure system according to claim 16, wherein a length of said conic reflection mirror is shorter than a length of said light pipe.

18. A projection exposure system according to claim 17, wherein said length of said conic reflection mirror is 90% of said length of said light pipe.

19. A projection exposure system comprising:

a light source for producing light;

transformed illumination means for forming a transformed illumination, said transformed illumination means including a light transmitting member for performing tilted illumination to provide tilted illuminated light, said light transmitting member including a light entrance pupil and a light exit pupil;

a fly's eye lens that receives said tilted illuminated light and diverges said tilted illuminated light to provide diverging tilted illuminated light;

a condenser lens that receives and focuses said diverging tilted illuminated light to produce condensed light.

20. A projection exposure system comprising:

a light source for producing light;

transformed illumination means for forming a transformed illumination, said transformed illumination means including a light transmitting member for performing tilted illumination to provide tilted illuminated light, said light transmitting member comprising:

a light pipe having a light entrance pupil and a light exit pupil, and a conic reflection mirror concentrically disposed in said light pipe having an apex directed toward said light source, said conic reflection mirror having a bottom diameter that is smaller than an inner diameter of said light exit pupil;

a fly's eye lens that receives said tilted illuminated light and diverges said tilted illuminated light to provide diverging tilted illuminated light; and a condenser lens that receives and focuses said diverging tilted illuminated light to produce condensed light.

* * * * *